United States Patent
Cronin et al.

(10) Patent No.: US 6,246,583 B1
(45) Date of Patent: *Jun. 12, 2001

(54) METHOD AND APPARATUS FOR REMOVING HEAT FROM A SEMICONDUCTOR DEVICE

(75) Inventors: John E. Cronin, Milton; Janak G. Patel; Dennis A. Schmidt, both of South Burlington, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/262,267

(22) Filed: Mar. 4, 1999

(51) Int. Cl.[7] .................................................. H05K 7/20
(52) U.S. Cl. ..................... 361/704; 361/702; 361/706; 361/710; 361/767; 257/706; 257/707; 174/16.3; 165/80.3
(58) Field of Search ............................. 361/702–710, 361/767, 753, 780, 792, 794, 795; 257/706–727, 679, 668, 723, 712, 687, 796, 758, 350, 347, 382; 165/80.3, 80.6, 80.2, 80.4, 185; 174/16.3, 52.4

(56) References Cited

U.S. PATENT DOCUMENTS

| | | | |
|---|---|---|---|
| 4,376,287 | * | 3/1983 | Sechi ........................................ 357/80 |
| 4,558,395 | | 12/1985 | Yamada et al. . |
| 5,018,004 | * | 5/1991 | Okinaga et al. ........................ 357/81 |
| 5,047,833 | | 9/1991 | Gould . |
| 5,198,693 | * | 3/1993 | Imken et al. ........................... 257/720 |
| 5,229,643 | * | 7/1993 | Ohta et al. ............................ 257/706 |
| 5,299,091 | | 3/1994 | Hoshi et al. . |
| 5,300,810 | | 4/1994 | Eden . |
| 5,311,402 | * | 5/1994 | Kobayashi et al. ................... 361/760 |
| 5,325,265 | | 6/1994 | Turlik et al. . |
| 5,347,428 | | 9/1994 | Carson et al. . |
| 5,352,926 | * | 10/1994 | Andrews ................................ 257/778 |
| 5,510,956 | * | 4/1996 | Suzuki .................................. 361/704 |
| 5,621,615 | * | 4/1997 | Dawson et al. ....................... 361/704 |
| 5,640,048 | * | 6/1997 | Selna .................................... 257/738 |
| 5,703,397 | * | 12/1997 | Endo et al. ........................... 257/701 |
| 5,907,189 | * | 5/1999 | Mertol .................................. 257/787 |
| 5,942,795 | * | 8/1999 | Hoang .................................. 257/692 |
| 5,955,781 | * | 9/1999 | Joshi .................................... 257/712 |

FOREIGN PATENT DOCUMENTS

410163386A * 6/1998 (JP) .............................. H01L/23/32

* cited by examiner

Primary Examiner—Leo P. Picard
Assistant Examiner—Michael Datskovsky
(74) Attorney, Agent, or Firm—Dugan & Dugan; Howard J. Walter, Jr.; Peter W. Peterson

(57) ABSTRACT

An apparatus and method are provided that remove sufficient heat from both SOI and non-SOI semiconductor devices to prevent the devices from overheating during operation. A plurality of thermally conductive pads such as electrically conductive studs are coupled to a first side of a semiconductor device having circuit elements formed thereon. The thermally conductive pads also are coupled to a substrate comprising an apparatus for extracting heat from the thermally conductive pads. The apparatus for extracting heat from the thermally conductive pads preferably comprises one or more metallic planes. A module cover having a thermally conductive path formed therein also may be coupled between the apparatus for extracting heat and a heat sink to further aid in heat removal from the semiconductor device. Thermally conductive pads may be coupled between the semiconductor device and I/O pins of the substrate to improve heat dissipation via the I/O pins.

25 Claims, 1 Drawing Sheet

METHOD AND APPARATUS FOR REMOVING HEAT FROM A SEMICONDUCTOR DEVICE

FIELD OF THE INVENTION

The present invention relates to semiconductor devices and more particularly to a method and apparatus for removing heat from a semiconductor device.

BACKGROUND OF THE INVENTION

A semiconductor device mounted within a carrier package has a maximum operating temperature dictated by the heat removal methods of the carrier package. If heat generated by a packaged semiconductor device is not effectively dissipated via the device's carrier package, the temperature of the device will increase until the device's maximum operating temperature is exceeded (i.e., until the device overheats), and the device will be damaged or destroyed.

Most semiconductor devices are formed from bulk silicon (e.g., from bulk silicon wafers), a material that has excellent thermal conduction properties. A bulk silicon device primarily dissipates heat through the backside of the silicon wafer die from which the silicon device is formed. For example, a conventional "packaged" semiconductor device may comprise a silicon wafer die having circuit elements formed on a first side or "frontside" thereof, an alumina substrate coupled to the frontside of the wafer die via a plurality of solder balls, a module cover coupled to a second or "backside" of the wafer die and to the substrate, and a heat sink coupled to the module cover. Heat primarily is dissipated from the semiconductor device via a "backside" thermal path from the frontside to the backside of the wafer die, from the backside of the wafer die to the module cover, from the module cover to the heat sink, and from the heat sink to the ambient environment.

Backside thermal paths are fairly effective at removing heat from semiconductor devices formed from bulk silicon wafers. However, the drive for higher speed and higher density circuits has lead to the use of non-conventional device materials such as silicon-on-insulator (SOI) wafers. An SOI wafer possesses an electrically insulating region between the frontside of the wafer (e.g., where the circuit elements are formed) and the backside of the wafer (e.g., where a module cover and a heat sink typically are coupled). This electrically insulating region has poor thermal conduction properties and significantly decreases the efficiency with which heat is conducted from the frontside to the backside of an SOI wafer (e.g., increases the "thermal resistance" of the wafer's backside thermal path). Therefore, conventional backside thermal paths are ineffective at removing heat from semiconductor devices formed on SOI wafers (i.e., SOI devices).

Accordingly, a need exists for a method and apparatus for removing heat from semiconductor devices formed on semiconductor wafers having backside thermal paths of high thermal resistance.

SUMMARY OF THE INVENTION

To address the needs of the prior art, an inventive apparatus and method are provided that remove sufficient heat from both SOI and non-SOI semiconductor devices to prevent the devices from overheating during operation. A plurality of thermally conductive pads (e.g., electrically conductive studs) are coupled to a first side of a semiconductor device having circuit elements formed thereon. As used herein, "coupled" means coupled directly or indirectly (e.g., via a non-electrically conductive, but thermally conductive material) so as to operate.

The thermally conductive pads are coupled to a substrate, and the substrate is provided with means for extracting heat from the thermally conductive pads. The means for extracting heat preferably comprises one or more metallic planes such as a ground plane, a voltage plane or the like. A module cover having a thermally conductive path formed therein also may be coupled between the substrate's means for extracting heat and a heat sink to further aid in heat removal from the thermally conductive pads, and thus from the semiconductor device. Thermally conductive pads additionally may be coupled between the semiconductor device and I/O pins of the substrate to improve heat dissipation via the I/O pins.

The combination of the thermally conductive pads, of the means for extracting heat from the substrate and of the module cover having a thermally conductive path, greatly enhances heat dissipation from a semiconductor device and therefore significantly reduces the risk of device overheating. The heat dissipation properties of the semiconductor device module formed from the semiconductor device, the substrate, the module cover and the heat sink may be further improved by tailoring other module material properties (e.g., by using epoxies having high thermal conductivities, by increasing the size of the heat sink, etc.).

Other objects, features and advantages of the present invention will become more fully apparent from the following detailed description of the preferred embodiments, the appended claims and the accompanying drawings. dr

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
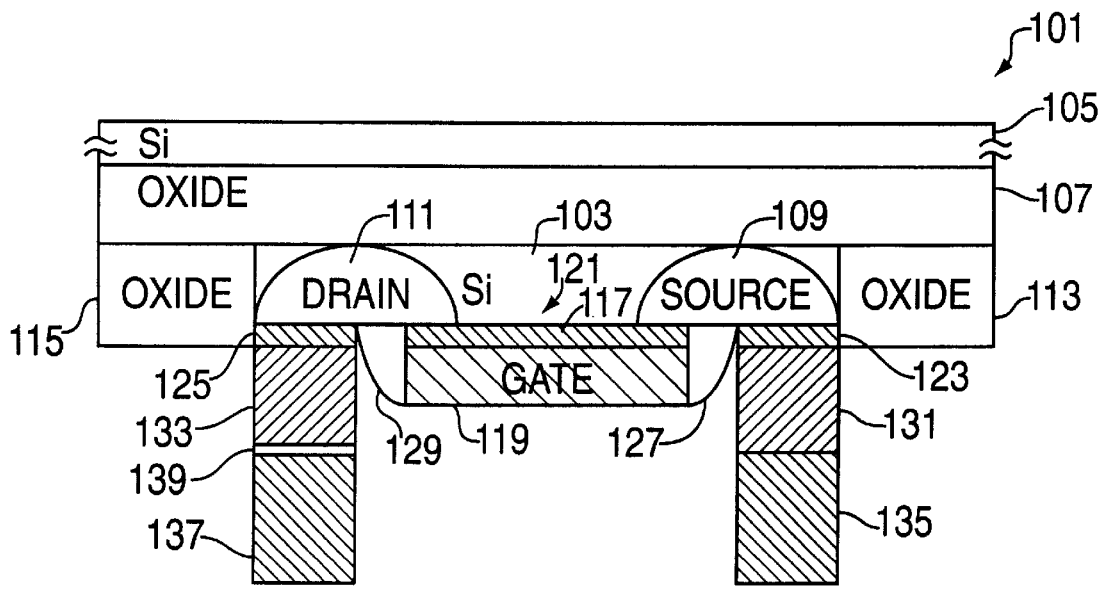
FIG. 1 is a cross-sectional view of an inventive SOI device configured in accordance with the present invention.

FIG. 1 is a cross-sectional view of a SOI metal-oxide-semiconductor field-effect-transistor (hereinafter "SOI device 101") configured in accordance with the present invention. The SOI device 101 comprises a top silicon region 103 that is electrically isolated from a bottom silicon region 105 via a buried oxide 107. In addition to being electrically insulating, the buried oxide 107 increases the thermal resistance of the thermal path between the top and bottom silicon regions 103, 105. The top silicon region 103 has a source diffusion region 109 and a drain diffusion region 111 formed therein, and is surrounded laterally by a first isolation oxidation region 113 and a second isolation oxidation region 115.

The SOI device 101 further comprises a gate oxide 117 and a gate contact 119 formed over a region 121 of the top silicon region 103 that serves as the channel of the SOI device 101. A source contact 123 is formed over the source diffusion region 109, and a drain contact 125 is formed over the drain diffusion region 111. The gate contact 119 is isolated from the source contact 123 via a first oxide region 127 and from the drain contact 125 via a second oxide region 129. First and second via contacts 131, 133 also are coupled to the source and drain contacts 123, 125, respectively.

In accordance with the present invention, a plurality of thermally conductive pads (e.g., electrically conductive pads having high thermal conduction properties such as copper) are coupled to the SOI device 101 to remove heat therefrom. Specifically, a first metal stud 135 is coupled to the source diffusion region 109 through the first via contact 131 and the source contact 123, and a second metal stud 137 is coupled to the drain diffusion region 111 through the second via contact 133 and the drain contact 125. If desired, a thermally conductive and electrically insulating material such as 1120 Series Thermal Joint Compound marketed by Wakefield Engineering or Thermalcote™ marketed by Thermalloy, Inc. may be provided between each metal stud and the device wiring to prevent electrical conduction therebetween (e.g., thermally conductive and electrically insulating layer 139 disposed between the second via contact 133 and the second metal stud 137).

The first metal stud 135 and the second metal stud 137 may comprise any geometries and any materials compatible with the geometries and the materials used to form the SOI device 101. For example, the first metal stud 135 and the second metal stud 137 may comprise wire bond connections, solder ball or "C4" connections, or other connections employed during the packaging of a wafer die. Preferably the first and the second metal studs 135, 137 comprise a high thermal conductivity material such as copper.

During operation of the SOI device 101, current flows through the channel formed within the region 121 ("channel region 121") of the top silicon region 103 and generates heat due to the resistance associated with the channel. If the buried oxide 107 was not present, a continuous silicon thermal path would exist between the channel region 121 and the bottom silicon region 105, and due to the high thermal conductivity of silicon (100 W/m-K), the heat generated within the channel region 121 would quickly travel through the silicon thermal path to the bottom silicon region 105 where it could be dissipated. However, with the buried oxide 107 present, the thermal path between the channel region 121 and the bottom silicon region 105 comprises both silicon and silicon dioxide. Because silicon dioxide's thermal conductivity (1 W/m-K) is approximately one hundred times smaller than silicon's thermal conductivity (100 W/m-K), heat generated within the channel region 121 of the SOI device 101 is not readily conducted to the bottom silicon region 105. The first metal stud 135 and the second metal stud 137, however, provide low thermal resistance paths for removing heat from the SOI device 101 as described below with reference to FIG. 2.

Figure 2:
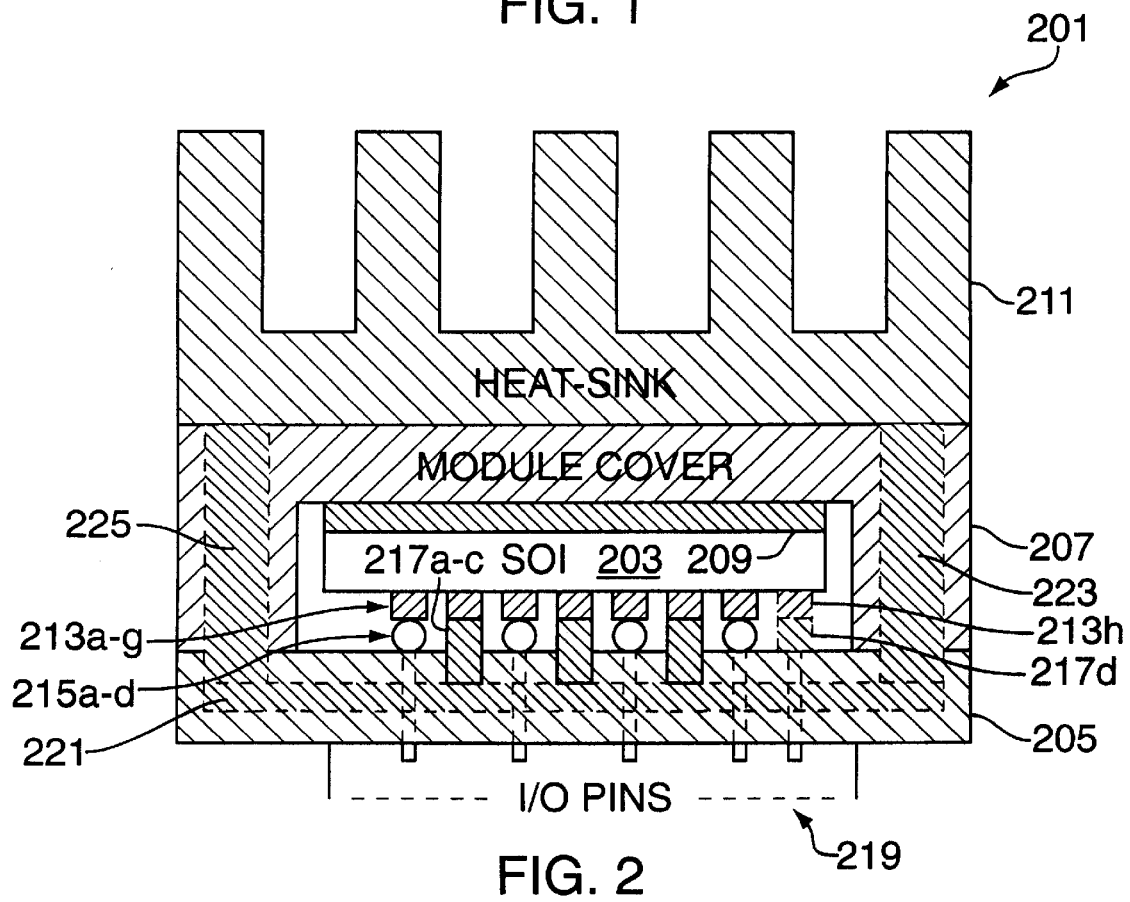
FIG. 2 is a cross-sectional view of an inventive semiconductor device module configured in accordance with the present invention.

FIG. 2 is a cross-sectional view of an inventive semiconductor device module 201 configured in accordance with the present invention. The inventive semiconductor device module 201 comprises a semiconductor device 203 coupled to a substrate 205, a module cover 207 coupled to the semiconductor device 203 via a thermal grease layer 209 and coupled to the substrate 205, and a heat sink 211 coupled to the module cover 207. The semiconductor device 203 comprises an SOI wafer die having circuit elements (not shown) on a first side thereof (e.g., one or more of the SOI device 101 of FIG. 1 and/or other integrated circuit elements). A final metal layer of the semiconductor device 203 is formed into a plurality of electrical contact pads 213a–g (such as the first via contact 131 and the second via contact 133 of FIG. 1).

The semiconductor device 203 is coupled to the substrate 205 via a plurality of solder balls 215a–d located between the substrate 205 and the electrical contact pads 213a, 213c, 213e and 213g. The solder balls 215a–d couple the electrical contact pads 213a, 213c, 213e and 213g to the Input/output (I/O) pins 219 of the substrate 205 (e.g., to allow connection of the semiconductor device 203 to the outside world).

In addition to the solder balls 215a–d, a plurality of thermally conductive pads 217a–c (such as the first metal stud 135 and the second metal stud 137 of FIG. 1) are coupled between the electrical contact pads 213b, 213d and 213f and a metallic plane 221 (e.g., a metallic ground or voltage plane) of the substrate 205. Thermally conductive pads also may be coupled between the semiconductor device 203 and the I/O pins 219 (as shown in phantom by thermally conductive pad 217d and electrical contact pad 213h). The module cover 207 is provided with a first thermal conduction path 223 and a second thermal conduction path 225 (e.g., metallic paths that couple the metallic plane 221 of the substrate 205 to the heat sink 211).

In general, the inventive semiconductor device module 201 provides superior heat dissipation for the semiconductor device 203 by reducing the thermal resistance between the semiconductor device 203 and the ambient environment. Heat thereby is conducted more readily from the semiconductor device 203.

The thermal resistance (RTH) of a material is computed as follows:

$$R_{TH} = \frac{t}{K_{TH}A}$$

where t is the thickness of the material, $K_{TH}$ is the thermal conductivity of the material and A is the cross-sectional area of the material. In accordance with the present invention, thermal resistances of heat dissipating thermal paths are reduced primarily by increasing cross-sectional area or by "effectively" increasing thermal conductivity through the use of additional, higher thermal conductivity materials. Material thicknesses also may be decreased to reduce thermal resistances, if desired.

With reference to FIG. 2, heat generated by the semiconductor device 203 is dissipated primarily via three paths:

path 1: from the semiconductor device 203 to the solder balls 215a–d and to the thermally conductive pad 217d, from the solder balls 215a–d and from the thermally conductive pad 217d to the I/O pins 219, from the I/O pins 219 to a printed circuit board (PCB) (not shown) coupled to the I/O pins 219 and from the PCB to a heat sink (not shown) coupled to the PCB;

path 2: from the semiconductor device 203 to the solder balls 215a–d and to the thermally conductive pads 217a–c, from the solder balls 215a–d and from the thermally conductive pads 217a–c to the substrate 205, from the substrate 205 to the module cover 207 and from the module cover 207 to the heat sink 211; and path 3: from the semiconductor device 203 to the thermal grease layer 209, from the thermal grease layer 209 to the module cover 207 and from the module cover 207 to the heat sink 211.

With regard to path 1, the inventive semiconductor device module 201 preferably reduces the thermal resistance of path 1 by increasing the cross-sectional area and the effective thermal conductivity of the portion of path 1 between the semiconductor device 203 and the I/O pins 219. For example, the thermally conductive pad 217d (in phantom)

and a plurality of additional thermally conductive pads (not shown) may be coupled between the semiconductor device 203 and voltage or ground pins of the I/O pins 219. The net cross-sectional area of material between the semiconductor device 203 and the I/O pins 219 thereby is increased, and thermal resistance is reduced.

The solder balls 215a–d typically comprise a lead/tin alloy of about 90% lead and 10% tin and have a thermal conductivity of about 50 W/m-K. In contrast, the preferred thermally conductive pad material (e.g., copper) has a thermal conductivity (400 W/m-K) of about eight times the thermal conductivity of the solder ball material. Accordingly, including thermally conductive pads between the semiconductor device 203 and the I/O pins 219 increases the effective thermal conductivity of the thermal path therebetween. Thus, the thermal resistance of path 1 is decreased by increasing both cross-sectional area and thermal conductivity.

The inventive semiconductor device module 201 similarly reduces the thermal resistance of path 2 by increasing the cross-sectional area of the portion of path 2 between the semiconductor device 203 and the substrate 205, and by increasing the effective thermal conductivity of the substrate 205 and of the module cover 207. Specifically, by including several thermally conductive pads such as the thermally conductive pads 217a–c between the semiconductor device 203 and the substrate 205, the cross-sectional area of the path therebetween is increased.

The substrate 205 typically comprises alumina and has a thermal conductivity of about 25 W/m-K. The metallic plane 221 however preferably comprises tungsten ($K_{TH}$=45 W/m-K) or molybdenum ($K_{TH}$=50 W/m-K) and thus increases the effective thermal conductivity of the substrate 205. Similarly, the module cover 207 typically comprises aluminum and has a thermal conductivity of about 154 W/m-K. The first thermal conduction path 223 and the second thermal conduction path 225 preferably comprise copper ($K_{TH}$=400 W/m-K) so as to increase the effective thermal conductivity of the module cover 207. Thus, the thermal resistance of path 2 is decreased within the semiconductor device module 201. The semiconductor device module 201 has little affect on the thermal resistance of path 3.

The combination of the thermally conductive pads 217a–c, of the metallic plane 221, of the first thermal conduction path 223 and of the second thermal conduction path 225 greatly enhances heat dissipation from the semiconductor device 203 and therefore significantly reduces the risk of the semiconductor device 203 overheating. The heat dissipation properties of the semiconductor device module 201 may be further improved by tailoring other semiconductor device module 201 material properties (e.g., by using epoxies having high thermal conductivities for bonding the module cover 207 to the substrate 205 and the heat sink 211 to the module cover 207, by increasing the size of the heat sink 211, etc.).

The foregoing description discloses only the preferred embodiments of the invention, modifications of the above disclosed apparatus and method which fall within the scope of the invention will be readily apparent to those of ordinary skill in the art. For instance, multiple metallic planes may be used to further reduce the thermal resistance of the substrate 205. The materials described herein for use as the thermally conductive pads 217a–c, the metallic plane 221, the first thermal conduction path 223 and the second thermal conduction path 225 are preferred, but other materials may be similarly employed. Further, additional thermally conductive pads may be placed near high current areas or other "hot spots" of the semiconductor device 203 to more effectively prevent device overheating.

Non-electrically conducting thermal layers may be used to prevent device shorting by the thermally conductive pads. The inventive semiconductor device module 201 also may be used with non-SOI devices to improve heat dissipation thereof. The metallic plane 221 may be placed on the top surface of the substrate 205 (e.g., the surface the solder balls 215a–d contact) to reduce the length of thermal path 2. However, if a top substrate surface metallic plane is employed, the solder balls 215a–d should be isolated therefrom.

Accordingly, while the present invention has been disclosed in connection with the preferred embodiments thereof, it should be understood that other embodiments may fall within the spirit and scope of the invention, as defined by the following claims.

The invention claimed is:

1. A method of removing heat from a semiconductor device comprising:
   a) providing a semiconductor device having a first side and an opposite, second side, the device having circuit elements on the first side;
   b) providing a plurality of thermally conductive pads on the first side of the device, at least one of the thermally conductive pads being provided so as to remove heat from the device rather than to provide electrical contact to the device;
   c) coupling the thermally conductive pads on the first side of the device to a substrate;
   d) providing within the substrate means for extracting heat from the thermally conductive pads, the heat extracting means being thermally coupled to the thermally conductive pads on the first side the device;
   e) providing a module cover thermally coupled to the second side of the device and having a thermally conductive path therein; and
   f) coupling the thermally conductive path of the module cover to the means for extracting heat of the substrate such that the module cover is thermally coupled to both the first and second sides of the semiconductor device and the device does not overheat.

2. The method of claim 1 wherein providing a semiconductor device comprises providing a silicon-on-insulator device.

3. The method of claim 1 wherein providing a plurality of thermally conductive pads comprises providing a plurality of thermally conductive pads coupled to a final metal layer of the circuit elements.

4. The method of claim 1 wherein providing a plurality of thermally conductive pads comprises providing at least one electrically conductive stud coupled to at least one of the circuit elements.

5. The method of claim 4 wherein providing at least one electrically conductive stud comprises providing at least one solder ball.

6. The method of claim 4 wherein providing at least one electrically conductive stud comprises providing at least one wire bond.

7. The method of claim 4 wherein providing at least one electrically conductive stud comprises providing at least one copper stud.

8. The method of claim 1 wherein providing a plurality of thermally conductive pads comprises providing a non-electrically conductive material coupled to at least one of the circuit elements and providing an electrically conductive stud coupled to the non-electrically conductive material.

9. The method of claim 1 wherein providing within the substrate means for extracting heat comprises providing a metallic plane within the substrate and wherein coupling the thermally conductive pads to the substrate comprises coupling at least one of the thermally conductive pads to the metallic plane of the substrate.

10. The method of claim 9 wherein providing a metallic plane within the substrate comprises providing a ground plane.

11. The method of claim 9 wherein providing a metallic plane within the substrate comprises providing a voltage plane.

12. The method of claim 1 wherein providing within the substrate means for extracting heat comprises providing a plurality of metallic planes within the substrate and wherein coupling the thermally conductive pads to the substrate comprises coupling each thermally conductive pad to one of the metallic planes of the substrate.

13. The method of claim 1 further comprising:
 g) providing a heat sink; and
 h) coupling the heat sink to the thermally conductive path of the module cover.

14. The method of claim 13 wherein providing within the substrate means for extracting heat comprises providing a metallic plane within the substrate and wherein providing a module cover having a thermally conductive path comprises providing a module cover having an electrically conductive path.

15. The method of claim 1 further comprising:
 g) providing the substrate with a plurality of I/O pins; and
 h) coupling at least one of the thermally conductive pads to the I/O pins.

16. A semiconductor device module formed by the method of claim 1.

17. A system for removing heat from a semiconductor device having a first side and an opposite, second side, the device having circuit elements on the first side thereof, the system comprising:
 a plurality of thermally conductive pads coupled to the first side of the semiconductor device, at least one of the thermally conductive pads being provided so as to remove heat from the device rather than to provide electrical contact to the device;
 a substrate coupled to the thermally conductive pads on the first side of the device;
 a substrate heat removal mechanism within the substrate adapted to extract heat from the thermally conductive pads, the heat extracting means being thermally coupled to the thermally conductive pads on the first side of the device; and
 a module cover thermally coupled to the second side of the device and having a thermally conductive path therein, the module cover's thermally conductive path coupled to the substrate heat removal mechanism such that the module cover is thermally coupled to both the first and second sides of the semiconductor device and the device does not overheat.

18. The system of claim 17 wherein the plurality of thermally conductive pads are coupled to a final metal layer of the circuit elements.

19. The system of claim 17 wherein the thermally conductive pads are electrically conductive.

20. The system of claim 19 wherein the electrically conductive pads are coupled to the first side of the semiconductor device via a non-electrically conductive material.

21. The system of claim 17 wherein the substrate heat removal mechanism comprises a metallic plane and wherein the thermally conductive pads are coupled to the metallic plane of the substrate.

22. The system of claim 21 further comprising:
 a heat sink coupled to the thermally conductive path of the module cover.

23. Means for removing heat from a semiconductor device having a first side and an opposite, second side, the device having circuit elements on a first side thereof, the means comprising:
 a plurality of thermally conductive means coupled to the first side of the semiconductor wafer for conducting heat therefrom, at least one of the thermally conductive means being provided so as to remove heat from the device rather than to provide electrical contact to the device:
 a substrate coupled to the thermally conductive means on the first side of the device;
 a substrate heat removal means within the substrate for extracting heat from the thermally conductive means, the heat extracting means being thermally coupled to the thermally conductive pads on the first side of the device; and
 a module cover means thermally coupled to the second side of the device and having a thermally conductive path therein, the thermally conductive path coupled to the substrate heat removal means such that the module cover is thermally coupled to both the first and second sides of the semiconductor device and the device does not overheat.

24. The system of claim 17 wherein the semiconductor device has a plurality of electrically conductive pads coupled to the first side of the semiconductor device and wherein the thermally conductive pads are coupled to the electrically conductive pads on the first side of the semiconductor device, and further including a thermally conductive and electrically resistive material between at least one of the electrically conductive pads and the thermally conductive pads on the first side of the device to prevent electrical conductivity but permit thermal conductivity from the semiconductor device to the thermally conductive pads.

25. A system for removing heat from a semiconductor device comprising:
 a semiconductor device having a first side and an opposite, second side, the device having circuit elements on the first side thereof;
 a plurality of electrically conductive pads coupled to the first side of the semiconductor device;
 a plurality of thermally conductive pads coupled to the electrically conductive pads coupled on the first side of the semiconductor device, at least one of the thermally conductive pads being provided so as to remove heat from the device rather than to provide electrical contact to the device; and
 a thermally conductive and electrically resistive material between at least one of the electrically conductive pads and the thermally conductive pads on the first side of the device to prevent electrical conductivity but permit thermal conductivity from the semiconductor device to the thermally conductive pads.

* * * * *

UNITED STATES PATENT AND TRADEMARK OFFICE
CERTIFICATE OF CORRECTION

PATENT NO. : 6,246,583 B1
DATED : June 12, 2001
INVENTOR(S) : Cronin et al.

Page 1 of 1

It is certified that error appears in the above-identified patent and that said Letters Patent is hereby corrected as shown below:

<u>Column 4,</u>
Line 27, delete "(RTH)" and substitute therefor -- ($R_{TH}$) --.

<u>Column 6, claim 1,</u>
Line 34, after "side" insert therefor -- of --.

Signed and Sealed this

Fifteenth Day of January, 2002

Attest:

JAMES E. ROGAN
*Director of the United States Patent and Trademark Office*

*Attesting Officer*